United States Patent
Zhao

(10) Patent No.: US 9,984,843 B2
(45) Date of Patent: May 29, 2018

(54) METHOD FOR DETECTING A LATENT FAILURE MODE IN AN ELECTRONIC SELECTOR HAVING AN INTERFACE SWITCH AND AT LEAST TWO UNDERLYING SWITCHES

(71) Applicant: GM GLOBAL TECHNOLOGY OPERATIONS LLC, Detroit, MI (US)

(72) Inventor: Ming Zhao, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 130 days.

(21) Appl. No.: 15/236,627

(22) Filed: Aug. 15, 2016

(65) Prior Publication Data

US 2018/0047534 A1 Feb. 15, 2018

(51) Int. Cl.
*G06M 3/02* (2006.01)
*H01H 47/00* (2006.01)
*H03K 21/38* (2006.01)
*B60T 7/08* (2006.01)
*B60R 16/023* (2006.01)

(52) U.S. Cl.
CPC ....... *H01H 47/002* (2013.01); *B60R 16/0231* (2013.01); *B60T 7/085* (2013.01); *H03K 21/38* (2013.01)

(58) Field of Classification Search
CPC ..... G05B 19/054; H04L 12/437; H04L 45/28; H04W 76/027
See application file for complete search history.

(56) References Cited

U.S. PATENT DOCUMENTS

| | | | |
|---|---|---|---|
| 9,286,056 B2 * | 3/2016 | Groover | G06F 8/65 |
| 2002/0075944 A1 * | 6/2002 | Zalio | H03G 3/3089 |
| | | | 375/147 |
| 2012/0151247 A1 * | 6/2012 | Ferraiolo | H04L 1/22 |
| | | | 714/4.5 |

* cited by examiner

*Primary Examiner* — Sibin Chen

(57) ABSTRACT

A method for detecting a latent failure mode in an electronic selector having an interface switch and at least two underlying switches includes tracking and counting each of the underlying switch's close/open status change counts in the context of tracking and counting the interface switch selection status change counts. The method continues by calculating the ratio of each underlying switch's close or open status change counts against the interface switch selection status change counts. By comparing these ratios from each underlying switch in respect to the interface switch selection status change counts, a set of new algorithms are formulated to detect an interface switch latent failure mode due to either one of the at least two underlying switches stuck to open or one of the at least two underlying switches chattering between close and open states at a relatively high frequency compared to the interface switch selection event.

30 Claims, 6 Drawing Sheets

METHOD FOR DETECTING A LATENT FAILURE MODE IN AN ELECTRONIC SELECTOR HAVING AN INTERFACE SWITCH AND AT LEAST TWO UNDERLYING SWITCHES

FIELD

The present disclosure relates to electronic selector devices and more particularly to electronic selector devices having an interface switch and at least two underlying switches.

BACKGROUND

The statements in this section merely provide background information related to the present disclosure and may or may not constitute prior art.

In engineering, redundancy is the inclusion of extra components or functions to a system that are not strictly necessary for normal operation but rather for the benefit of increasing reliability, usually in the form of a backup or fail-safe.

In the interest of maintaining increased system reliability provided by redundancy, it is important to have a method to detect if duplicate components or functions included in a system have faded or are operating at a state that is susceptible to a latent failure event such that replacement will be required soon.

A conventional latent failure detection method places two systems with duplicate components in parallel. Basically, when the same inputs are simultaneously provided to the duplicate systems, the same results are expected to be provided at the outputs simultaneously, or within some time tolerance window, unless a true failure or latent failure is present in one of the systems.

From the foregoing, it is apparent that approaches to detect latent failures in redundant systems but aspects of the disclosed exemplary embodiments seek to provide improved approaches.

SUMMARY

Aspects of an exemplary embodiment provide a method for detecting a latent failure mode in an electronic selector having an interface switch and at least two underlying switches. The exemplary method includes incrementing a first interface switch selection counter if a first or a second of the at least two underlying switches is selected greater than or equal to a predetermined switch status confirmation time. Other aspects of the exemplary embodiment include incrementing a first underlying switch closed counter each time if the first of the at least two underlying switches is closed from an open state for the predetermined switch status verification time, and incrementing a first underlying switch open counter each time if the first of the at least two underlying switches is opened from a closed state for the predetermined switch status verification time. Still further aspects according to the exemplary embodiment include incrementing a second underlying switch closed counter each time if the second of the at least two underlying switches is closed from an open state for the predetermined switch status verification time, and incrementing a second underlying switch open counter each time if the second of the at least two underlying switches is opened from a closed state for the predetermined switch status verification time.

Still other aspects of the exemplary method include detecting if a first of the at least two underlying switches is stuck open when the first interface switch selection counter value is greater than or equal to a predetermined stuck open confirmation minimum threshold value, and detecting if a second of the at least two underlying switches is stuck open when the first interface switch selection counter value is greater than or equal to a predetermined stuck open confirmation minimum threshold value. Further aspects of the method include reporting a switch latent failure mode is confirmed to a control module and resetting all counters when either the first or the second of the at least two underlying switches is detected as stuck open when the first interface switch selection counter value is greater than or equal to a predetermined stuck open confirmation minimum threshold value. Other aspects of the method include reporting a no switch latent failure mode is confirmed to a control module and resetting all counters when neither the first nor the second of the at least two underlying switches is detected as stuck open when the first interface switch selection counter value is greater than or equal to a predetermined pass confirmation maximum threshold value. Further aspects of the method include reporting a switch latent failure mode is unconfirmed to the control module when either the first or the second of the at least two underlying switches has not yet been detected as stuck open.

Still further aspects according to the exemplary method include incrementing a second interface switch selection counter if a first or a second of the at least two underlying switches is selected greater than or equal to a predetermined switch status confirmation time. Still other aspects of the method include incrementing a third underlying switch closed counter each time if the first of the at least two underlying switches is closed from an open state for the predetermined switch status verification time, and incrementing a third underlying switch open counter each time if the first of the at least two underlying switches is opened from a closed state for the predetermined switch status verification time. Other aspects include incrementing a fourth underlying switch closed counter each time if the second of the at least two underlying switches is closed from an open state for the predetermined switch status verification time, and incrementing a fourth underlying switch open counter each time if the second of the at least two underlying switches is opened from a closed state for the predetermined switch status verification time.

Aspects according to the exemplary embodiment also include starting an adaptive underlying switch chattering detection timer if the interface switch is transitioned from unselected state to selected state and the adaptive underlying switch chattering detection timer has not yet started or is still in reset state; and resetting the adaptive underlying switch chattering detection timer, the second interface switch selection counter, and the third and fourth underlying switch close/open counters when the adaptive underlying switch chattering detection timer is greater than or equal to an adaptive time out threshold. Another aspect includes detecting if the first or second of the at least two underlying switches is chattering when the second interface switch selection counter value is greater than or equal to a predetermined switch chattering confirmation minimum threshold value.

Still further aspects of the exemplary method include reporting a switch latent failure mode is confirmed to the control module, and resetting all counters and the adaptive underlying switch chattering detection timer when either the first or the second of the at least two underlying switches is detected as chattering when the second interface switch selection counter value is greater than or equal to a predetermined switch chattering confirmation minimum threshold value. Other aspects of the method include reporting a no switch latent failure mode is confirmed to the control module, and also resetting all counters and the adaptive underlying switch chattering detection timer when neither the first nor the second of the at least two underlying switches is detected as chattering when the second interface switch selection counter value is greater than or equal to a predetermined pass confirmation maximum threshold value. Still further aspects of the method include reporting a latent failure mode is unconfirmed to the control module when either the first or the second of the at least two underlying switches has not yet detected as chattering. Another aspect of the method includes activating a switch latent failure mode operator alert and resetting all counters and the adaptive underlying switch chatter detection timer after the switch latent failure mode is reported Aspects of a second exemplary embodiment for detecting a latent failure mode in an electronic selector having an interface switch and at least two underlying switches include incrementing first and second interface switch selection counters if a first or a second of the at least two underlying switches is selected greater than or equal to a predetermined switch status confirmation time, and incrementing a first underlying switch closed counter each time if the first of the at least two underlying switches is closed from an open state for the predetermined switch status verification time, and incrementing a first underlying switch open counter each time if the first of the at least two underlying switches is opened from a closed state for the predetermined switch status verification time. Other aspects include incrementing a second underlying switch closed counter each time if the second of the at least two underlying switches is closed from an open state for the predetermined switch status verification time, and incrementing a second underlying switch open counter each time if the second of the at least two underlying switches is opened from a closed state for the predetermined switch status verification time.

Further aspects of the second exemplary method include incrementing a third underlying switch closed counter each time if the first of the at least two underlying switches is closed from an open state for the predetermined switch status verification time, and incrementing a third underlying switch open counter each time if the first of the at least two underlying switches is opened from a closed state for the predetermined switch status verification time. Still further aspects include incrementing a fourth underlying switch closed counter each time if the second of the at least two underlying switches is closed from an open state for the predetermined switch status verification time, and incrementing a fourth underlying switch open counter each time if the second of the at least two underlying switches is opened from a closed state for the predetermined switch status verification time.

Other aspects according to the second exemplary embodiment include detecting if a first or a second of the at least two underlying switches is stuck open when the first interface switch selection counter value is greater than or equal to a predetermined stuck open confirmation minimum threshold value, and detecting if the first or the second of the at least two underlying switches is chattering when the second interface switch selection counter value is greater than or equal to a predetermined switch chattering confirmation minimum threshold value.

Additional aspects of the second embodiment include reporting a switch latent failure mode is confirmed to a control module when either the first or the second of the at least two underlying switches is detected as stuck open when the first interface switch selection counter value is greater than or equal to a predetermined stuck open confirmation minimum threshold value, and reporting a switch latent failure mode is confirmed to the control module when either the first or the second of the at least two underlying switches is detected as chattering when the second interface switch selection counter value is greater than or equal to a predetermined switch chattering confirmation minimum threshold value.

Still further aspects of the second exemplary method include reporting a switch latent failure mode is unconfirmed to the control module when either the first or the second of the at least two underlying switches has not yet detected as stuck open, and reporting a switch latent failure mode is unconfirmed to the control module when either the first or the second of the at least two underlying switches has not yet detected as chattering. Another aspect of the second exemplary method includes activating a switch latent failure mode operator alert and resetting all counters and the adaptive underlying switch chatter detection timer after the switch latent failure mode is reported.

Aspects of the second exemplary method also include detecting if the first interface switch selection counter value is greater than or equal to a predetermined pass confirmation maximum threshold value, and detecting if the first interface switch selection counter value is greater than or equal to a predetermined pass confirmation minimum threshold value when the first interface switch selection counter value is not greater than or equal to the predetermined pass confirmation maximum threshold value. Still other aspects include detecting if the first interface switch selection counter value is greater than or equal to a predetermined pass confirmation low threshold value when a switch latent failure mode is confirmed, and detecting if the first interface switch selection counter value is greater than or equal to a predetermined pass confirmation high threshold value when a switch chattering latent failure mode is confirmed.

Further aspects as according to the second exemplary embodiment include detecting if each ratio of the switch closed counter values of the first and the second of the at least two underlying switches over the first interface switch selection counter value is greater than or equal to a predetermined switch toggle threshold value when the first interface switch selection counter value is greater than or equal to the predetermined pass confirmation high threshold value, and detecting if each ratio of the switch open counter values of the first and the second of the at least two underlying switches over the first interface switch selection counter value is greater than or equal to the predetermined switch toggle threshold value when each ratio of the switch closed counter values of the first and the second of the at least two underlying switches over the first interface switch selection counter value is greater than or equal to the predetermined switch toggle threshold value.

Still further aspects of the second method include reporting a switch latent failure mode unconfirmed to the control module when the interface switch is selected, and each ratio of the switch open counter values of the first and the second of the at least two underlying switches over the first interface switch selection counter value is greater than or equal to the predetermined switch toggle threshold value, and reporting no switch latent failure mode confirmed to the control module and resetting all counters and the adaptive underlying switch chatter detection timer when the interface switch is not selected and each ratio of the switch open counter values of the first and the second of the at least two underlying switches over the first interface switch selection counter value is greater than or equal to the predetermined switch toggle threshold value.

Other aspects of the second exemplary embodiment include detecting if the ratio of the first underlying switch closed counter value over the first interface switch selection counter value is less than or equal to a predetermined switch concurrent threshold high value and greater than or equal to a predetermined switch concurrent threshold low value when a switch latent failure mode is not confirmed, and detecting if the ratio of the second underlying switch closed counter value over the first interface switch selection counter value is less than or equal to the predetermined switch concurrent threshold high value and greater than or equal to the predetermined switch concurrent threshold low value when the ratio of the first underlying switch closed counter value over the first interface switch selection counter value is less than or equal to a predetermined switch concurrent threshold high value and greater than or equal to a predetermined switch concurrent threshold low value.

Another aspect of the second embodiment includes reporting no switch latent failure mode confirmed to the control module and resetting all counters and the adaptive underlying switch chatter detection timer when the interface switch is not selected, and the ratio of the second underlying switch closed counter value over the first interface switch selection counter value is less than or equal to the predetermined switch concurrent threshold high value and greater than or equal to the predetermined switch concurrent threshold low value. Still another aspect includes reporting a switch latent failure mode unconfirmed to the control module when either the ratio of each switch closed counter values of the first and the second of the at least two underlying switches over the first interface switch selection counter value is not greater than or equal to the predetermined switch toggle threshold value or the ratio of each switch open counter values of the first and the second of the at least two underlying switches over the first interface switch selection counter value is not greater than or equal to the predetermined switch toggle threshold value.

Yet another aspect according to the second exemplary includes detecting if the ratio of each switch closed counters of the first and the second underlying switches over the first interface switch selection counter is greater than or equal to a predetermined switch non-concurrent threshold value when a switch chattering failure mode has not been confirmed. Still another aspect includes reporting a switch latent failure mode unconfirmed to the control module when the interface switch is selected and the ratio of both switch closed counters of the first and the second underlying switches over the first interface switch selection counter is greater than or equal to a predetermined switch non-concurrent threshold value.

A further aspect of the second exemplary embodiment includes detecting if the first interface switch selection counter is greater than or equal to a pass confirmation high threshold value when the ratio of each switch closed counters the first and the second underlying switches over the first interface switch selection counter is not greater than or equal to a predetermined switch non-concurrent threshold value. Still another aspect of the second embodiment includes reporting a switch latent failure mode unconfirmed to the control module when the first interface switch selection counter is not greater than or equal to a pass confirmation high threshold value.

A third exemplary embodiment for a method for detecting a latent failure mode in an electronic park brake button having an interface switch and at least two underlying switches includes incrementing first interface switch selection counters if a first or a second of the at least two underlying switches is selected greater than or equal to a predetermined switch status confirmation time. Further aspects of the third exemplary embodiment include incrementing a first underlying switch closed counter each time the first of the at least two underlying switches is closed from an open state for the predetermined switch status verification time, and incrementing a first underlying switch open counter each time the first of the at least two switches is opened from a closed state for the predetermined switch status verification time.

Still further aspects include incrementing a second underlying switch closed counter each time the second of the at least two underlying switches is closed from an open state for the predetermined switch status verification time, and incrementing a second underlying switch open counter each time the second of the at least two underlying switches is opened from a closed state for the predetermined switch status verification time. Yet further aspects include detecting if the first interface switch selection counter value is greater than or equal to a predetermined stuck open confirmation minimum threshold value, and detecting if a first of the at least two underlying switches is stuck open when the first interface switch selection counter value is greater than or equal to a predetermined stuck open confirmation minimum threshold value. Another aspect of the third exemplary embodiment includes detecting if a second of the at least two underlying switches is stuck open when the first interface switch selection counter value is greater than or equal to a predetermined stuck open confirmation minimum threshold value.

Still further aspects of the third exemplary embodiment include reporting a switch latent failure mode is confirmed to a control module when either the first or the second of the at least two underlying switches is detected as stuck open when the interface switch selection counter value is greater than or equal to a predetermined stuck open confirmation minimum threshold value, or reporting a switch latent failure mode is unconfirmed to the control module when both the first and the second of the at least two underlying switches have not yet detected as stuck open. Other aspect according to the third embodiment includes reporting a no interface switch latent failure mode is confirmed to a control module when neither the first nor the second of the at least two underlying switches is detected as stuck open when the interface switch selection counter value is greater than or equal to a predetermined pass confirmation maximum threshold value. Another aspect according to the third embodiment includes activating a switch latent failure mode operator alert and resetting all counters after the switch latent failure mode is reported. It is appreciated that a switch latent failure mode operator alert may be either audible, visible, haptic or combinations thereof as according to aspects of the exemplary embodiments.

A fourth embodiment for a method for detecting a latent failure mode in an electronic park brake button having an interface switch and at least two underlying switches includes incrementing first and second interface switch selection counters if a first or a second of the at least two underlying switches is selected greater than or equal to a predetermined switch status confirmation time. Further aspects of the fourth exemplary embodiment include incrementing a first underlying switch closed counter each time if the first of the at least two switches is closed from an open state for the predetermined switch status verification time, and incrementing a first underlying switch open counter each time if the first of the at least two switches is opened from a closed state for the predetermined switch status verification time.

Yet further aspects of the fourth embodiment include incrementing a second underlying switch closed counter each time if the second of the at least two underlying switches is closed from an open state for the predetermined switch status verification time, and incrementing a second underlying switch open counter each time if the second of the at least two underlying switches is opened from a closed state for the predetermined switch status verification time. Still further aspects include incrementing a third underlying switch closed counter each time if the first of the at least two underlying switches is closed from an open state for the predetermined switch status verification time, and incrementing a third underlying switch open counter each time if the first of the at least two underlying switches is opened from a closed state for the predetermined switch status verification time.

Other aspects of the fourth embodiment include incrementing a fourth underlying switch closed counter each time if the second of the at least two underlying switches is closed from an open state for the predetermined switch status verification time, and incrementing a fourth underlying switch open counter each time if the second of the at least two underlying switches is opened from a closed state for the predetermined switch status verification time. Still other aspects include detecting if a first or a second of the at least two underlying switches is stuck open when the first interface switch selection counter value is greater than or equal to a predetermined stuck open confirmation minimum threshold value, and detecting if the first or the second of the at least two underlying switches is chattering when the second interface switch selection counter value is greater than or equal to a predetermined switch chattering confirmation minimum threshold value.

Yet further aspects according to the fourth embodiment include reporting a switch latent failure mode is confirmed to a control module when either the first or the second of the at least two underlying switches is detected as stuck open when the first interface switch selection counter value is greater than or equal to a predetermined stuck open confirmation minimum threshold value or as chattering when the second interface switch selection counter value is greater than or equal to a predetermined switch chattering confirmation minimum threshold value. Other aspects according to the fourth embodiment include reporting a no interface switch latent failure mode is confirmed to a control module when neither the first nor the second of the at least two underlying switches is detected as stuck open or chattering when the first interface switch selection counter value is greater than or equal to a predetermined pass confirmation maximum threshold value.

Still further aspects of the fourth exemplary embodiment include reporting a switch latent failure mode is unconfirmed to the control module when both the first and the second of the at least two underlying switches have not yet detected as stuck open, and also when both the first and the second of the at least two underlying switches have not yet detected as chattering. Still another aspect of the fourth exemplary embodiment includes activating a switch latent failure mode operator alert and resetting all counters, and the adaptive underlying switch chattering detection timer after the switch latent failure mode is reported.

Further aspects, advantages and areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 5:
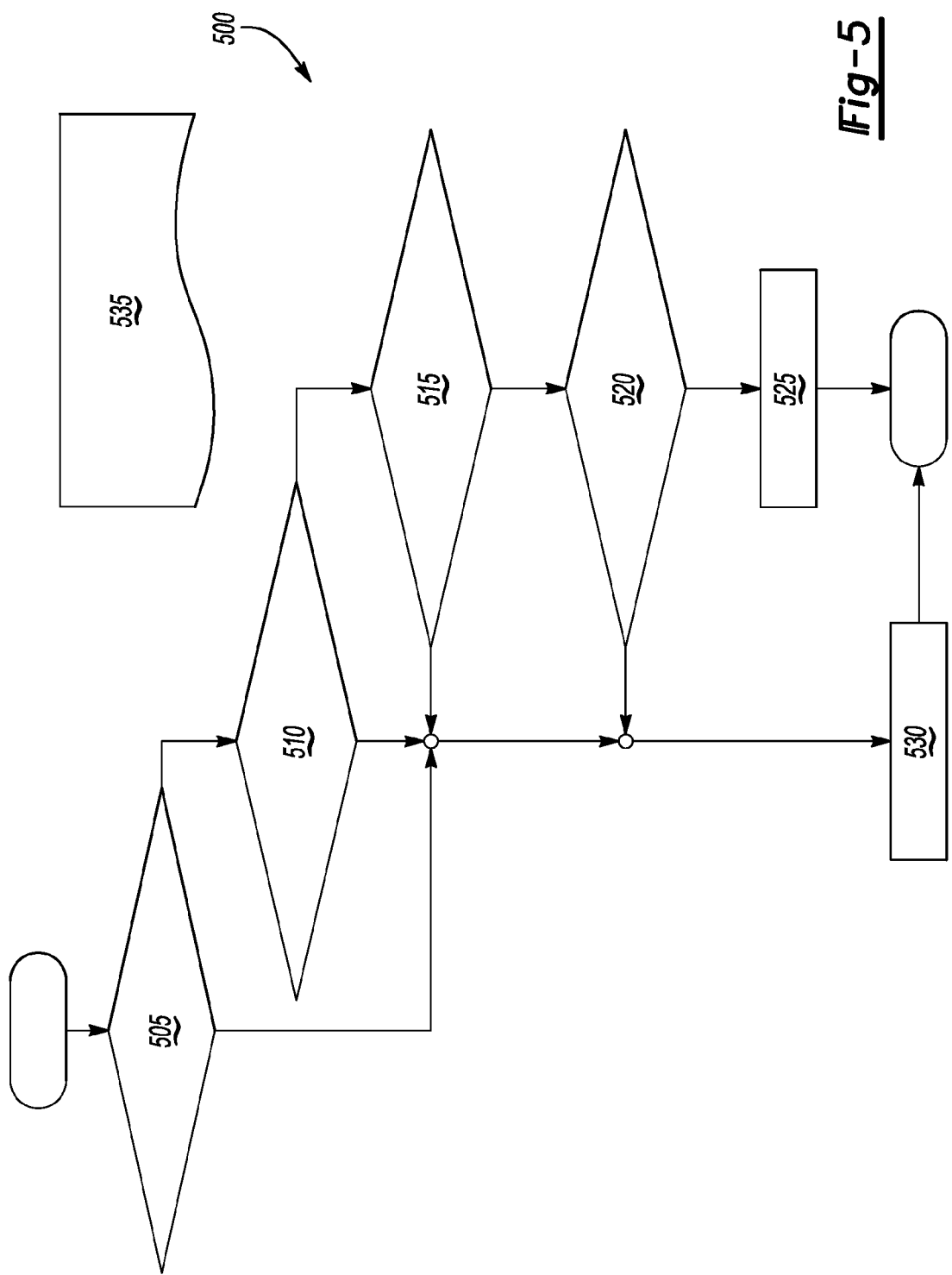
Figure 6:
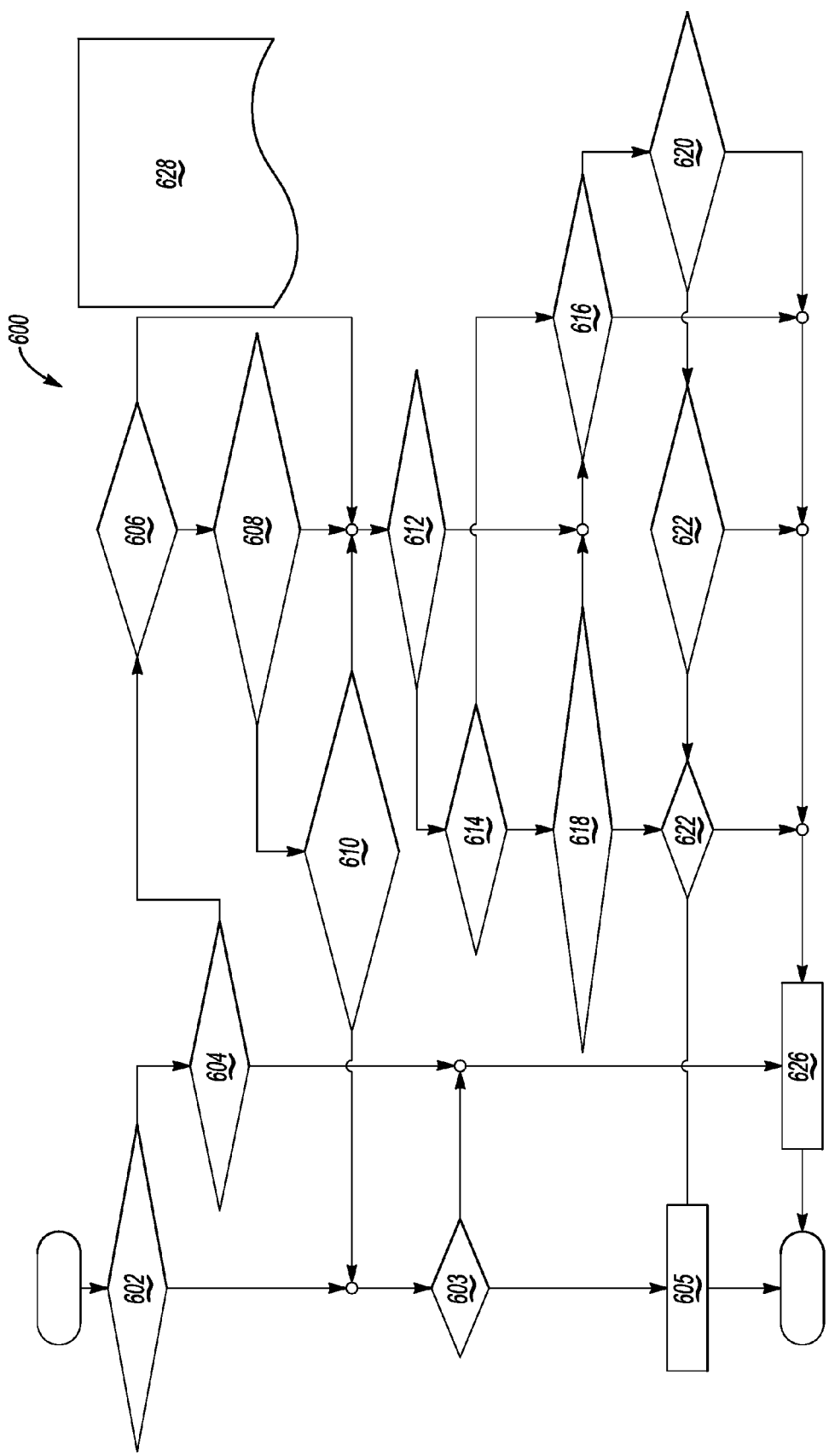

FIG. 5 illustrates aspects of an exemplary embodiment of an algorithm for detecting when a second underlying switch is chattering between close/open states while a first underlying switch closes/opens normally; and FIG. 6 illustrates aspects of an exemplary embodiment of an algorithm for detecting when neither the first nor the second underlying switches have caused a stuck open or chattering failure mode.

DETAILED DESCRIPTION

The following description is merely exemplary in nature and is not intended to limit the present disclosure, application, or uses. As such, it is appreciated that the exemplary embodiment disclosed herein may be suitable for use in various industries including, but not limited to, automotive, maritime, aerospace, healthcare, agricultural, information technology, and national security.

According to aspects of an exemplary embodiment of a method for detecting a latent failure mode in an electronic selector having an interface switch and at least two underlying switches, a system block diagram 100 is illustrated. The system 100 includes an electronic transmission range select (ETRS) shifter 105 including an interface switch 110 operable to select a "Park" position of a transmission when it is depressed. For the purpose of increasing the reliability of selecting the park position of the transmission when the interface switch 110 is depressed, the system 100 includes at least two underlying switches (not shown) that are independently operable to command the transmission to the park position. As such, if either of the at least two underlying switches should be become inoperable then the other switch will still be operable as a "back-up" to command the transmission to the park position.

A shifter interface board (SIB) 115 is in communication with the ETRS shifter 105 and a shifter display 120 through wirelines 125. The SIB 115 is also in communication with an engine control module (ECM) 130, which is operable as the brains of an ETRS control system, in the context of this disclosure, through a controller area network (CAN) sensor bus 132 and another CAN powertrain expansion bus 133.

The ECM 130 also interfaces with other components that are integral to the exemplary embodiments. Notably, the ECM 130 communicates with the electric park brake (EPB) 140 and the body control module (BCM) 145 through the local area network (LAN) 134. The EPB 140 is operable to electrically apply the park brake when activated, and the BCM 145 is operable to manage various other components such as the instrument panel cluster (IPC) 147 and the passive entry/passive start (PEPS) 148 system through the low speed CAN bus 146.

The ECM 130 also communicates with an electronic brake control module (EBCM) 150 that is operable to manage the EPB 140 and the anti-lock brake system (not shown) based on sensing devices and other inputs. Further, the ECM 130 communicates with the transmission control module (TCM) 160 through the LAN 134 as well as a local interconnect network (LIN) 135 as according to exemplary embodiments of the system 100. The TCM 160 primarily controls operation of a transmission 170 through inputs received from various sensors, the ECM 130, and amongst other components. A manual park release (MPR) device 180 is provided through a release cable, as a mechanism to manually disengage the transmission 170 from the park position in case when vehicle 12-voltage battery electric power is lost after the park pawl (not shown) is engaged.

Figure 1:
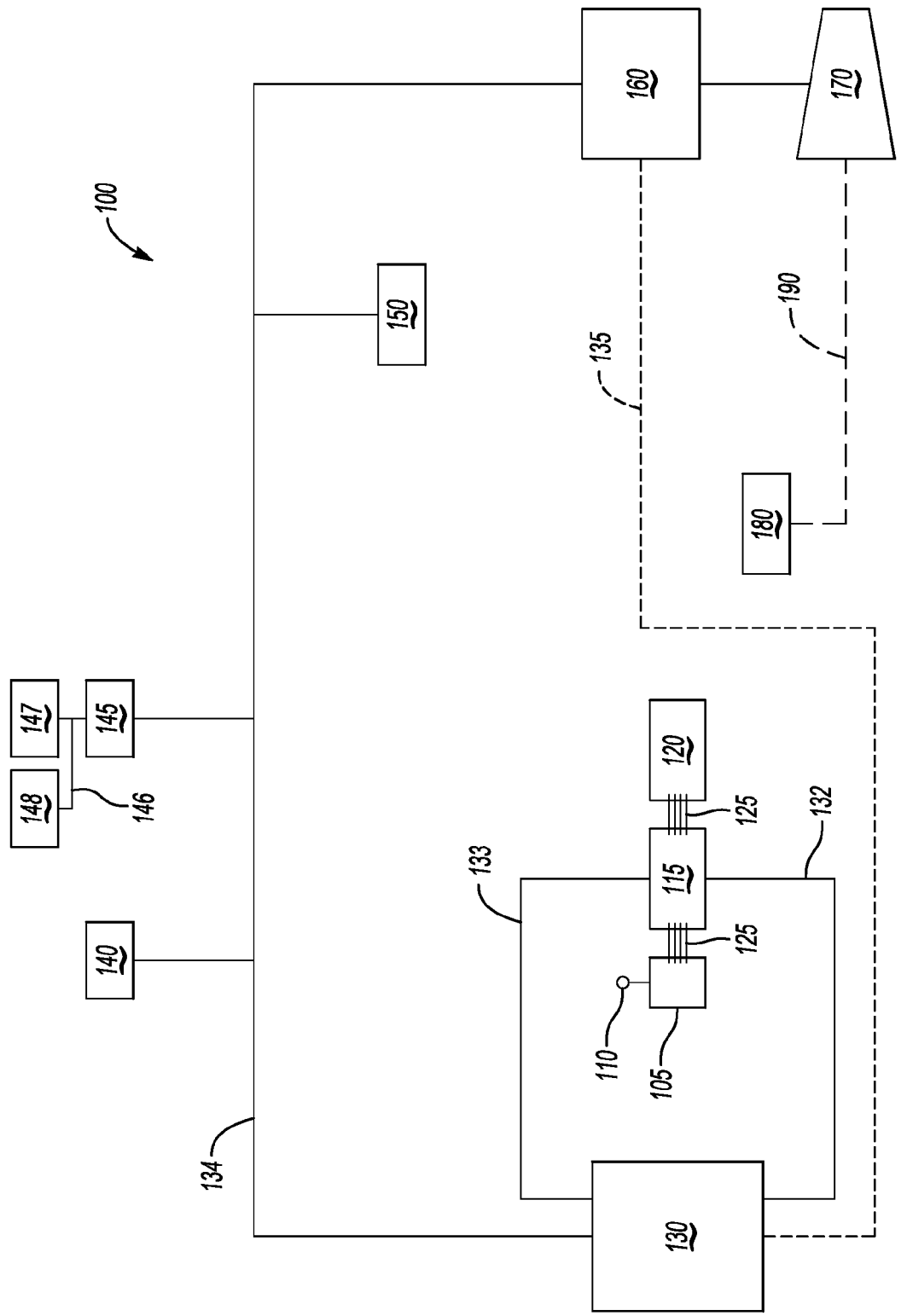
FIG. 1 illustrates aspects of an exemplary embodiment of a system block diagram for detecting a latent failure mode in an electronic selector having an interface switch and at least two underlying switches.
Figure 2:
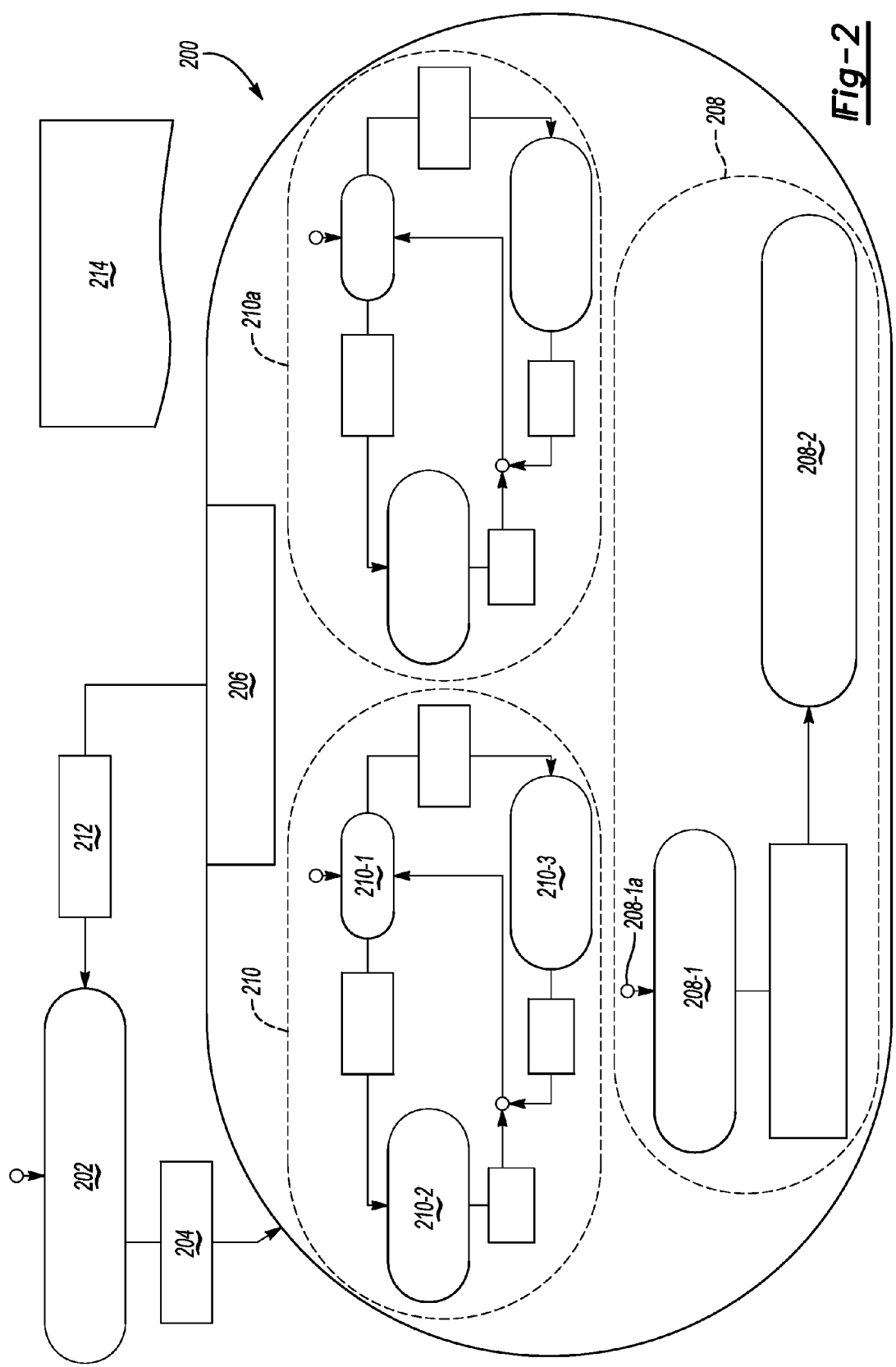
FIG. 2 illustrates aspects of an exemplary embodiment of a state transition diagram of tracking and counting the underlying switches close/open status vs the interface switch selected/unselected events and managing adaptive switch chattering detection timer.

FIG. 2 illustrates aspects of an exemplary embodiment of a state transition diagram 200 of tracking and counting each of the two underlying switches close/open status versus the interface switch 110 selected/unselected events and managing the adaptive switch chattering detection timer (not shown). At starting default state 202, the park brake button (interface switch) 110 is unselected and enter state action is to set the park brake button selected flag to FALSE. At state transition path 204, both the first and the second of the at least two underlying switches are monitored independently. If at least one of the underlying switches are closed for a predetermined switch status confirmation time, state 202 is exited and state 206 is entered. At state 206, the enter state action is to set the park brake button 110 to TRUE and to increment a park brake button selection counter. As according to an exemplary embodiment, there are first and second park brake button (interface switch) selection counters. At state transition path 212, if both the first and second of the underlying switches are open for a predetermined switch status confirmation time then the state 206 is exited and returned to state 202 where the park brake button 110 is considered as unselected. It is appreciated that the park brake button switch is substituted for the interface switch 110 as according to exemplary embodiments presented in this disclosure.

At a parallel sub-state 208 under state 206, an adaptive underlying switch chattering timer (not shown) is managed. During entering default state 208-1 under state 208, state transition action 208-1a is to start the underlying switch chattering timer if the chattering detection flag is equal to FALSE. At state 208-1, the enter state action is to set the chattering detection flag to TRUE When the switch chattering detection timer value is greater than or equal to a product based on a predetermined switch chatter timer threshold value and a chatter timer threshold value multiplier (wherein the chatter timer threshold multiplier is equal to one (1) plus a product based on a predetermined switch chatter timer threshold factor and the second interface switch selection counter value), state 208-2 under state 208 is entered and the state enter actions are to reset the adaptive underlying switch chattering timer, third and fourth underlying switch close/open counter values, and a second park brake button selection counter value associated with the underlying switch chattering detection algorithm of FIG. 5 (described in the later section of this disclosure).

At the other two parallel sub-states 210 and 210a under state 206, the verified close/open statuses of the first and second underlying switches are tracked and counted respectively. It is appreciated that the sub-state 210 and 210a are identical and execute in parallel and therefore a description of sub-state 210 will also apply to sub-state 210a. Sub-state 210 begins from a transitional sub-state 210-1 to verify if the first underlying switch is closed or open for a predetermined switch status verification time. If either is verified then enter state action into the corresponding closed state 210-2 or open state 210-3 is to increment a closed or open counter, respectively, per event. If the first underlying switch cannot be verified closed or open for the predetermined switch status verification time or can no longer be verified to stay in closed state 210-2 or open state 210-3, it stays or re-enters the transitional state 210-1. It is appreciated that there are first and third underlying switch close or open counters associated with the first of the two underlying switches, and there are second and fourth underlying switch close or open counters associated with the second of the two underlying switches. The first and second underlying switch close/open counters, along with the first park brake button selection counter, are used for the underlying switch stuck to open detection algorithm of FIG. 4 (described in the later section of this disclosure) while the third and fourth underlying switch close/open counters, along with the second park brake button selection counter, are used for the underlying switch chattering between close/open states detection algorithm of FIG. 5 (described in the later section of this disclosure). The first and second underlying switch close/open counters, along with the first park brake button selection counter, are also used for the confirmation algorithm of neither an underlying switch stuck to open nor chattering between close/open states depicted in FIG. 6 (described in the later section of this disclosure). As according to the exemplary embodiment of FIG. 2, calibration parameters are as follows: the switch status confirmation time is equal to one hundred (100) milliseconds; the switch verification time is equal to fifty (50) milliseconds; the switch chattering detection timer threshold is equal to six hundred (600) milliseconds; and the switch chattering detection timer threshold factor is equal to twenty five (25) percent.

Figure 3:
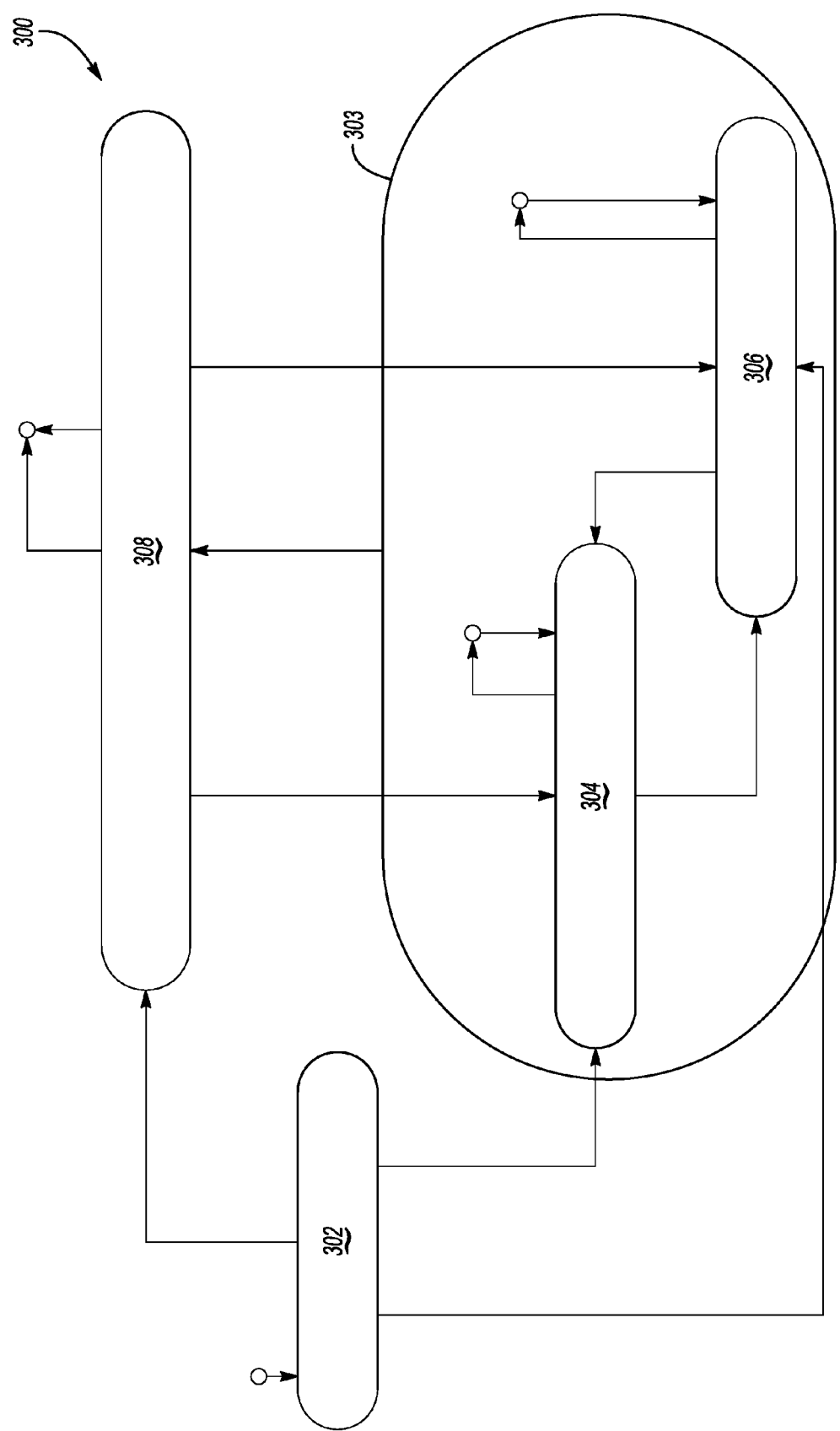
FIG. 3 illustrates aspects of an exemplary embodiment of a state transition diagram for monitoring the an underlying switch stuck to open or chattering between close\open states failure modes while the interface switch is selected.

Referring to FIG. 3, a state transition diagram 300 for monitoring if an underlying switch is in a failure mode of either stuck to open or chattering between close/open states is illustrated. It is appreciated that the state transition diagram of FIG. 2 is always invoked in front of the state transition diagram of FIG. 3 within the same computational execution loop. At starting default state 302, the interface switch latent failure mode is unknown and the enter state action is to report the diagnostic result PENDING. At state 303, a switch latent failure mode of either an underlying switch stuck open is confirmed at sub-state 304 or an underlying switch chattering is confirmed at sub-state 306. The state enter action under state 303, which includes the mutually exclusive state 304 or 306, is to report the diagnostic result FAIL. If both underlying switches are confirmed to be in neither stuck open nor chattering failure mode, then entering state 308 and the enter state action is to report the diagnostic result PASS. The other common state enter actions of state 304, 306 or 308 are to reset all park brake button selection counter values, underlying switch close/open counter values associated with either underlying switch stuck open diagnostic algorithms of FIG. 4 and FIG. 6 or underlying switch chattering diagnostic algorithms of FIG. 5 and FIG. 6. Therefore, a next round of underlying switch stuck open or chattering diagnostics can be repeated with new sets of aforementioned counter values.

As according to aspects of the exemplary embodiments, the method for detecting a latent failure mode in an electronic selector having an interface switch and at least two underlying switches includes providing counters for counting the events of selecting the interface switch (park brake button) and counting the open/close events for each of the at least two underlying switches. This includes incrementing first and second interface switch selection counters if a first or a second of the at least two underlying switches is selected greater than or equal to a predetermined switch status confirmation time; incrementing a first underlying switch closed counter each time if the first of the at least two switches is closed from an open state; incrementing a first underlying switch open counter each time if the first of the at least two switches is opened from a closed state; incrementing a second underlying switch closed counter each time if the second of the at least two switches is closed from an open state; and incrementing a second underlying switch open counter each time if the second of the at least two switches is opened from a closed state; incrementing a third underlying switch closed counter each time if the first of the at least two switches is closed from an open state; incrementing a third underlying switch open counter each time if the first of the at least two switches is opened from a closed state; incrementing a fourth underlying switch closed counter each time if the second of the at least two switches is closed from an open state; and incrementing a fourth underlying switch open counter each time if the second of the at least two switches is opened from a closed state. The first of the park brake button selection counter values, the first and the second underlying switch close/open counter values derived from the state transition diagram of FIG. 2 without the additional constraints added by the sub-state 208 under state 206 can be used in cooperation with the algorithm of FIG. 4 (described in the later section of this disclosure) and FIG. 6 (described in the later section of this disclosure) to detect one underlying switch stuck open latent failure mode under the governance of the state transition diagram of FIG. 3. The second of the park brake button selection counter value, the third and the fourth underlying switch close/open counter values derived from the state transition diagram of FIG. 2 with the additional constraints added by the sub-state 208 under state 206 can be used in cooperation with the algorithm of FIG. 5 (described in the later section of this disclosure) and FIG. 6 (described in the later section of this disclosure) to detect one underlying switch chattering latent failure mode under governance of the state transition diagram of FIG. 3.

Figure 4:
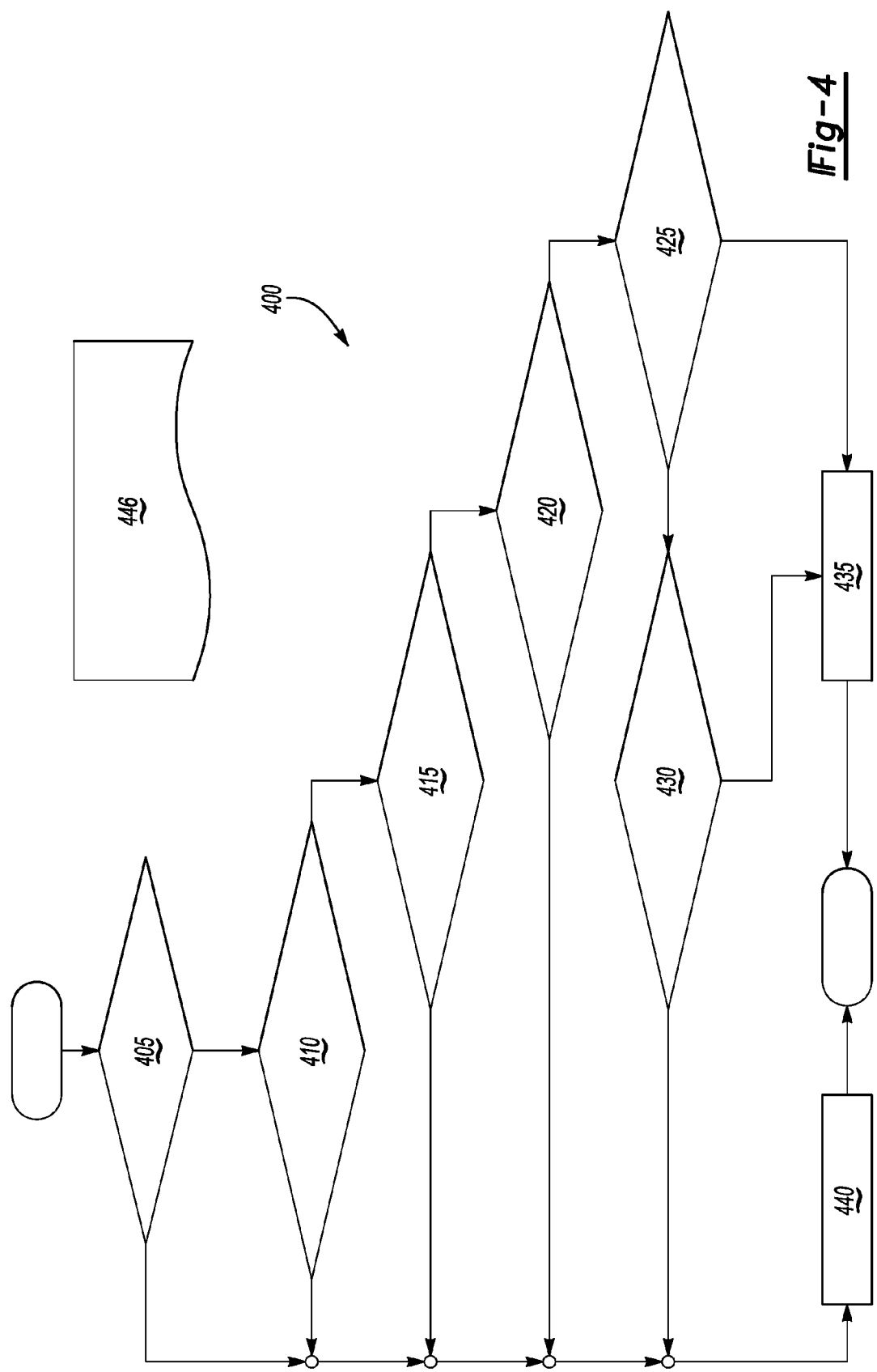
FIG. 4 illustrates aspects of an exemplary embodiment of an algorithm for detecting when a second underlying switch is stuck to open while a first underlying switch closes/opens normally.

Referring now to FIG. 4, an algorithm 400 for detecting when a second underlying switch is stuck to open while a first underlying switch closes/opens normally is illustrated as according to an exemplary embodiment. It is appreciated that algorithm of FIG. 4 is invoked with the highest priority by the corresponding state transition condition checking mechanism under the state transition diagram of FIG. 3. In addition, algorithm of FIG. 4 should always be used in the combination with algorithm of FIG. 6 (described in the later section of this disclosure). At block 405, the exemplary method begins with detecting if the first interface switch selection counter values is greater than or equal to a predetermined stuck open confirmation minimum threshold value. If the first interface switch selection counter value is not greater than or equal to the predetermined stuck open confirmation minimum threshold value then the method moves to block 440 where an underlying switch stuck open failure mode is determined to be unconfirmed or return a switch latent fault mode unconfirmed status to the state transition diagram of FIG. 3. If the first interface switch selection counter value is greater than or equal to the predetermined stuck open confirmation minimum threshold value then the method continues at block 410.

At block 410, the method continues with detecting if a ratio of the second underlying switch open counter value over the first interface switch selection switch counter value is greater than or equal to a predetermined switch stuck open high threshold. If the ratio of the second underlying switch open counter value over the first interface switch selection switch counter value is greater than or equal to the predetermined switch stuck open high threshold then the method continues at block 415. If the ratio of the second underlying switch open counter value over the first interface switch selection switch counter value is not greater than or equal to the predetermined switch stuck open high threshold then the method moves to block 440 with reporting a switch stuck open latent failure mode unconfirmed to the state transition diagram of FIG. 3.

At block 415, the method continues with detecting if the ratio of the second underlying switch close counter value over the first interface switch selection counter value is less than or equal to a predetermined switch stuck open low threshold. If the ration of the second underlying switch close counter value over the first interface switch selection counter value is less than or equal to the predetermined switch stuck open low threshold then the method continues at block 420. If the ratio of the second underlying switch close counter value over the first interface switch selection counter value is not less than or equal to the predetermined switch stuck open low threshold value then the method moves to block 440 with reporting a switch stuck open latent failure mode unconfirmed to the state transition diagram of FIG. 3.

Next, the exemplary method continues with detecting if the first of the at least two underlying switches has been closing/opening normally when the first interface switch selection counter value is greater than or equal to a predetermined stuck open confirmation minimum threshold value. At block 420, this begins with detecting if the ratio of the first underlying switch closed counter value over the first interface switch selection counter value is greater than or equal to the predetermined switch stuck open high threshold. If the ratio of the first underlying switch closed counter value over the first interface switch selection counter value is greater than or equal to the predetermined switch stuck open high threshold then the method continues at block 425. If the ratio of the first underlying switch closed counter value over the first interface switch selection counter value is not greater than or equal to the predetermined switch stuck open high threshold then the method continues at block 440 with reporting a switch stuck open latent failure mode unconfirmed to the state transition diagram of FIG. 3.

At block 425, the method continues with detecting if the ratio of the first underlying switch open counter value over the first interface switch selection counter value is less than or equal to the predetermined switch stuck open low threshold. If the ratio of the first underlying switch open counter value over the first interface switch selection counter value is less than or equal to the predetermined switch stuck open low threshold then the method moves to block 435 where the second underlying switch stuck open failure mode is confirmed or reported FAIL to the state transition diagram of FIG. 3. If the ratio of the first underlying switch open counter value over the first interface switch selection counter value is not less than or equal to the predetermined switch stuck open low threshold then the method continues at block 430.

At block 430, the method continues with detecting if the ratio of the first underlying switch open counter value over the first interface switch selection counter value is greater than or equal to the predetermined switch stuck open high threshold. If the ratio of the first underlying switch open counter value over the first interface switch selection counter value is greater than or equal to the predetermined switch stuck open high threshold then the second underlying switch stuck open failure mode is confirmed at block 435 or reported FAIL to the state transition diagram of FIG. 3. If the ratio of the first underlying switch open counter value over the first interface switch selection counter value is not greater than or equal to the predetermined switch stuck open high threshold then the method continues at block 440 with reporting a switch stuck open latent failure mode unconfirmed to the state transition diagram of FIG. 3. As according to the exemplary embodiment of FIG. 4, calibration parameters 446 are as follows: the stuck open confirmation minimum threshold is equal to a seven (7) count; the switch stuck open high threshold is equal to eighty five (85) percent; and the switch stuck open low threshold is equal to twelve (12) percent.

Referring now to FIG. 5, an algorithm 500 for detecting when a second underlying switch is chattering between close/open states while a first underlying switch closes/opens normally is illustrated as according to an exemplary embodiment. It is appreciated that the algorithm of FIG. 5 can be used in combination with the algorithm of FIG. 4 and, as such, will be discussed in accordance with such combination or portions thereof. The algorithm of FIG. 5 is invoked with the second highest priority by the corresponding state transition condition checking mechanism under the state transition diagram of FIG. 3. In addition, the algorithm of FIG. 5 should also always be used in the combination with the algorithm of FIG. 6 (described in the later section of this disclosure). At block 505, switch chatter detection begins with detecting if the second interface switch (park brake button) selection counter is greater than or equal to a predetermined switch chattering confirmation minimum threshold. If the second interface switch (park brake button) selection counter is greater than or equal to the predetermined switch chattering confirmation minimum threshold then the method continues to block 510. If the second interface switch selection counter is not greater than or equal to the predetermined switch chattering confirmation minimum threshold then the method moves to block 530 reporting a switch chattering latent failure mode unconfirmed to the state transition diagram of FIG. 3.

At block 510, the method continues with determining if the first of the at least two underlying switches has been closing/opening normally by detecting if a ratio of the third underlying switch closed counter value over the second interface switch selection counter value is greater than or equal to a predetermined non-chattering switch threshold. If the ratio of third underlying switch closed counter value over the second interface switch selection counter value is greater than or equal to the predetermined non-chattering switch threshold then the method moves to block 515. If the ratio of the third underlying switch closed counter value over the second interface switch selection counter value is not greater than or equal to the predetermined non-chattering switch threshold then the method moves to block 530 for reporting a switch chattering latent failure mode unconfirmed to the-state transition diagram of FIG. 3.

At block 515, the method continues with detecting if the fourth underlying switch closed counter value is greater than or equal to a predetermined chattering switch threshold. If the fourth underlying switch closed counter value is greater than or equal to the predetermined chattering switch threshold then the method moves to block 520. If the fourth underlying switch closed counter value is not greater than or equal to the predetermined chattering switch threshold then the method moves to block 530 for reporting a switch chattering latent failure mode unconfirmed to the-state transition diagram of FIG. 3.

At block 520, the method continues with detecting if the fourth underlying switch open counter value is greater than or equal to the predetermined switch chattering threshold. If the fourth underlying switch open counter value is greater than or equal to the predetermined switch chattering threshold then the method moves to block 525 where the second underlying switch chattering latent failure mode is confirmed or reported FAIL to the state transition diagram of FIG. 3. If the fourth underlying switch open counter value is not greater than or equal to the predetermined switch chattering threshold then the method moves to block 530 reporting a switch chattering latent failure mode unconfirmed to the state transition diagram of FIG. 3. As according to the exemplary embodiment of FIG. 5, calibration parameters 535 are as follows: the switch chattering confirmation minimum threshold is equal to one (1) count; the non-chattering switch threshold is equal to ninety (90) percent; and the chattering switch threshold is equal to six (6) counts.

Referring now to FIG. 6, an algorithm 600 for detecting when neither the first nor the second underlying switches have a stuck open or chattering failure mode is illustrated as according to aspects of an exemplary embodiment. It is appreciated that the algorithm of FIG. 6 should always be used in combination with either the algorithm of FIG. 4, the algorithm FIG. 5, or the algorithms of FIG. 4 and FIG. 5 in combination and as such, an exemplary embodiment will be discussed in accordance with such a combination algorithms of FIG. 4 and FIG. 5 or portions thereof. Since the algorithm of FIG. 6 is used in combination of the algorithm FIG. 4 and the algorithm of FIG. 5 in the context of this disclosure, the first interface switch selection counter, the first and the second underlying switch close/open counters are required to be used to calculate all respective ratios. The algorithm of FIG. 6 is invoked with the lowest priority by the corresponding state transition condition checking mechanism under the state transition diagram of FIG. 3. The method begins at block 602 with detecting if the first interface switch (park brake button) selection counter value is greater than or equal to a predetermined pass confirmation maximum threshold. If the first interface switch selection counter value is greater than or equal to a predetermined pass confirmation maximum threshold then the method continues at block 603 with detecting if the interface switch is selected. If the interface switch is not selected then the method moves to block 605 for reporting no switch latent failure mode confirmed or PASS to the state transition diagram of FIG. 3. If the interface switch is selected then the method moves to block 626 for reporting a switch latent failure mode unconfirmed to the state transition diagram of FIG. 3. If the first interface switch selection counter value is not greater than or equal to a predetermined pass confirmation maximum threshold then the method continues at block 604.

Block 604 continues the exemplary method with detecting if the first interface switch selection counter value is greater than or equal to a predetermined pass confirmation minimum threshold. If the first interface switch selection counter value is greater than or equal to the predetermined pass confirmation minimum threshold then the method continues at block 606. If the first interface switch selection counter value is not greater than or equal to the predetermined pass confirmation minimum threshold then the method moves to block 626 for reporting a switch latent failure mode unconfirmed to the state transition diagram of FIG. 3.

At block 606, the exemplary method continues with determining if a switch latent failure mode of either stuck open or chattering has been confirmed. If a switch latent failure mode of either stuck open or chattering has been confirmed then the method continues at block 612. If a switch latent failure mode of either stuck open or chattering has not been confirmed then the method continues at block 608.

At block 608, the method continues with detecting if the ratio of the first underlying switch closed counter value over the first interface switch selection counter value is less than or equal to a predetermined switch concurrent threshold high value and greater than or equal to a predetermined switch concurrent threshold low value. If the ratio of the first underlying switch closed counter value over the first interface switch selection counter value is less than or equal to the predetermined switch concurrent threshold high value and greater than or equal to the predetermined switch concurrent threshold low value then the method continues at block 610. If the ratio of the first underlying switch closed counter value over the first interface switch selection counter value is not less than or equal to the predetermined switch concurrent threshold high value or not greater than or equal to the predetermined switch concurrent threshold low value then the method continues at block 612.

At block 610, the method continues with detecting if the ratio of the second underlying switch closed counter value over the first interface switch selection counter value is less than or equal to the predetermined switch concurrent threshold high value and greater than or equal to the predetermined switch concurrent threshold low value. If the ratio of the second underlying switch closed counter value over the first interface switch selection counter value is less than or equal to the predetermined switch concurrent threshold high value and greater than or equal to the predetermined switch concurrent threshold low value then the method moves to block 603 with detecting if the interface switch is selected. If the interface switch is not selected at block 603 then the method moves to block 605 for reporting no switch latent failure mode confirmed or PASS to the state transition diagram of FIG. 3. If the interface switch is selected then the method moves to block 626 for reporting a switch latent failure mode unconfirmed to the state transition diagram of FIG. 3. If the ratio of the second underlying switch closed counter value over the first interface switch selection counter value is not less than or equal to the predetermined switch concurrent threshold high value or not greater than or equal to the predetermined switch concurrent threshold low value then the method continues at block 612.

At block 612, the method continues with detecting if the first interface switch selection counter value is greater than or equal to a predetermined pass confirmation low threshold. If the first interface switch selection counter value is greater than or equal to the predetermined pass confirmation low threshold then the method continues at block 614. If the first interface switch selection counter value is not greater than or equal to the predetermined pass confirmation low threshold then the method continues at c block 616.

At block 614, the method continues with detecting if a switch chattering latent failure mode has been confirmed. If a switch chattering latent failure mode has been confirmed then the method moves to block 616. If a switch chattering latent failure mode has not been confirmed then the moves to block 618. At block 616, the method continues with detecting if the first interface switch selection counter value is greater than or equal to a predetermined pass confirmation high threshold. If the first interface switch selection counter value is greater than or equal to the predetermined pass confirmation high threshold then the method continues at block 620. If the first interface switch selection counter value is not greater than or equal to the predetermined pass confirmation high threshold then the method moves to block 626 for reporting a switch latent failure mode unconfirmed to the state transition diagram of FIG. 3.

At block 618, the method continues with detecting if the ratio of both the first and the second underlying switch closed counters over the first interface switch selection counter are greater than or equal to a predetermined switch non-concurrent threshold. If the ratio of both the first and the second underlying switch closed counters over the first interface switch selection counter are greater than or equal to the predetermined switch non-concurrent threshold then the method continues at block 624. Block 624 continues with detecting if the interface switch is selected. If the interface switch is selected then the method moves to block 626 for reporting a switch latent failure mode unconfirmed to the state transition diagram of FIG. 3. If the interface switch is not selected then the method continues to block 605 for reporting a no switch latent failure mode confirmed or PASS to the state transition diagram of FIG. 3.

Referring again from block 618, if the ratio of either the first or the second underlying switch closed counters over the first interface switch selection counter is not greater than or equal to the predetermined switch non-concurrent threshold then the method moves to block 616. At block 616, the method continues with detecting if the first interface switch selection counter value is greater than or equal to a predetermined pass confirmation high threshold. If the first interface switch selection counter value is greater than or equal to the predetermined pass confirmation high threshold then the method continues at block 620.

At block 620, the method continues with detecting if the ratio of the closed counter values of both the first and the second of the at least two underlying switches over the first interface switch selection counter value are greater than or equal to a predetermined switch toggle threshold value. If the ratio of the closed counter values of both the first and the second of the at least two underlying switches over the first interface switch selection counter value are greater than or equal to the predetermined switch toggle threshold value then the moves to block 622. If the ratio of the closed counter values of either the first or the second of the at least two underlying switches over the first interface switch selection counter value is not greater than or equal to the predetermined switch toggle threshold value then the method moves to block 626 for reporting a switch latent failure mode unconfirmed to the state transition diagram of FIG. 3.

At block 622, the method continues with detecting if the ratio of the open counter values of both the first and the second of the at least two underlying switches over the first interface switch selection counter value are greater than or equal to a predetermined switch toggle threshold value. If the ratio of the open counter values of both the first and the second of the at least two underlying switches over the first interface switch selection counter value are greater than or equal to the predetermined switch toggle threshold value then the method moves to block 624. At block 624, the method continues with detecting if the interface switch is selected. If the interface switch is selected then the method moves to block 626 for reporting a switch latent failure mode unconfirmed to the state transition diagram of FIG. 3. If the interface switch is not selected then the method continues to block 605 for reporting a no switch latent failure mode confirmed or PASS to the state transition diagram of FIG. 3. If the ratio of the open counter values of either the first or the second of the at least two underlying switches over the second interface switch selection counter value is not greater than or equal to the predetermined switch toggle threshold value then the method moves to block 626 for reporting a switch latent failure mode unconfirmed to the state transition diagram of FIG. 3.

As according to the exemplary embodiment of FIG. 6, calibration parameters 628 are as follows: the pass confirmation maximum threshold is equal to nine (9) counts; the pass confirmation high threshold is equal to one (1) count; the pass confirmation high threshold is equal to five (5) counts; the pass confirmation low threshold is equal to three (3) counts; the switch concurrent threshold low is equal to ninety (90) percent; the switch concurrent threshold high is equal to one hundred ten (110) percent; the switch non-concurrent threshold is equal to fifty (50) percent; and the switch toggle threshold is equal to thirty (30) percent.

The description of the invention is merely exemplary in nature and variations that do not depart from the gist of the invention are intended to be within the scope of the invention. Such variations are not to be regarded as a departure from the spirit and scope of the invention.

What is claimed is:

1. A method for detecting a latent failure mode in an electronic selector having an interface switch and at least two underlying switches comprising:
    incrementing a first interface switch selection counter if a first or a second of the at least two underlying switches is selected greater than or equal to a predetermined switch status confirmation time;
    incrementing a first underlying switch closed counter each time if the first of the at least two underlying switches is closed from an open state;
    incrementing a first underlying switch open counter each time if the first of the at least two underlying switches is opened from a closed state;
    incrementing a second underlying switch closed counter each time if the second of the at least two underlying switches is closed from an open state;
    incrementing a second underlying switch open counter each time if the second of the at least two underlying switches is opened from a closed state;
    detecting if a first of the at least two underlying switches is stuck open when the first interface switch selection counter value is greater than or equal to a predetermined stuck open confirmation minimum threshold value;
    detecting if a second of the at least two underlying switches is stuck open when the first interface switch selection counter value is greater than or equal to a predetermined stuck open confirmation minimum threshold value;
    reporting a switch latent failure mode is confirmed to a control module when either the first or the second of the at least two underlying switches is detected as stuck open when the first interface switch selection counter value is greater than or equal to a predetermined stuck open confirmation minimum threshold value; and
    reporting a no switch latent failure mode is confirmed to a control module and resetting all counters when neither the first nor the second of the at least two underlying switches is detected as stuck open and when the first interface switch selection counter value is greater than or equal to a predetermined pass confirmation maximum threshold value.

2. The method of claim 1 further comprising incrementing a second interface switch selection counters if a first or a second of the at least two underlying switches is selected greater than or equal to a predetermined switch status confirmation time.

3. The method of claim 2 further comprising incrementing a third underlying switch closed counter each time if the first of the at least two switches is closed from an open state, and incrementing a third underlying switch open counter each time if the first of the at least two switches is opened from a closed state.

4. The method of claim 3 further comprising incrementing a fourth underlying switch closed counter each time if the second of the at least two switches is closed from an open state, and incrementing a fourth underlying switch open counter each time if the second of the at least two switches is opened from a closed state.

5. The method of claim 4 further comprising starting an adaptive underlying switch chattering detection timer if the interface switch is transitioned from unselected state to selected state.

6. The method of claim 5 further comprising resetting the adaptive underlying switch chattering detection timer, the second interface switch selection counter, and the third and fourth underlying switch counters when the adaptive underlying switch chattering detection timer is greater than or equal to an adaptive time out threshold.

7. The method of claim 6 further comprising detecting if the first or second of the at least two underlying switches is chattering when the second interface switch selection counter value is greater than or equal to a predetermined switch chattering confirmation minimum threshold value.

8. The method of claim 7 further comprising reporting a switch latent failure mode is confirmed to the control module, and resetting all counters and the adaptive underlying switch chattering detection timer when either the first or the second of the at least two underlying switches is detected as chattering.

9. The method of claim 8 further comprising reporting a switch latent failure mode is unconfirmed to the control module, and resetting the adaptive underlying switch chattering detection timer, the third and fourth underlying switch counters, and the second interface switch counter when the adaptive underlying switch chattering detection timer is greater than or equal to the adaptive threshold.

10. The method of claim 9 further comprising reporting a no switch latent failure mode is confirmed to the control module, and resetting all counters and the adaptive underlying switch chattering detection timer when neither the first nor the second of the at least two underlying switches is detected as chattering and when the second interface switch selection counter value is greater than or equal to a predetermined pass confirmation maximum threshold value.

11. The method of claim 1 further comprising activating a switch latent failure mode operator alert and resetting all counters and the adaptive underlying switch chatter detection timer after the switch latent failure mode is reported.

12. A method for detecting a latent failure mode in an electronic selector having an interface switch and at least two underlying switches comprising:
   incrementing first and second interface switch selection counters if a first or a second of the at least two underlying switches is selected greater than or equal to a predetermined switch status confirmation time;
   incrementing a first underlying switch closed counter each time if the first of the at least two underlying switches is closed from an open state, and incrementing a first underlying switch open counter each time if the first of the at least two underlying switches is opened from a closed state;
   incrementing a second underlying switch closed counter each time if the second of the at least two underlying switches is closed from an open state, and incrementing a second underlying switch open counter each time if the second of the at least two underlying switches is opened from a closed state;
   incrementing a third underlying switch closed counter each time if the first of the at least two underlying switches is closed from an open state, and incrementing a third underlying switch open counter each time if the first of the at least two underlying switches is opened from a closed state;
   incrementing a fourth underlying switch closed counter each time if the second of the at least two underlying switches is closed from an open state, and incrementing a fourth underlying switch open counter each time if the second of the at least two underlying switches is opened from a closed state;
   detecting if a first or a second of the at least two underlying switches is stuck open when the first interface switch selection counter value is greater than or equal to a predetermined stuck open confirmation minimum threshold value;
   detecting if the first or the second of the at least two underlying switches is chattering when the second interface switch selection counter value is greater than or equal to a predetermined switch chattering confirmation minimum threshold value;
   reporting a switch latent failure mode is confirmed to a control module when the first or the second of the at least two underlying switches is detected as stuck open when the first interface switch selection counter value is greater than or equal to a predetermined stuck open confirmation minimum threshold value; and
   activating a switch latent failure mode operator alert and resetting all counters and the adaptive underlying switch chatter detection timer after the switch latent failure mode is reported.

13. The method of claim 12 further comprising detecting if the first interface switch selection counter value is greater than or equal to a predetermined pass confirmation maximum threshold value.

14. The method of claim 13 further comprising detecting if the first interface switch selection counter value is greater than or equal to a predetermined pass confirmation minimum threshold value when the first interface switch selection counter value is not greater than or equal to the predetermined pass confirmation maximum threshold value.

15. The method of claim 14 further comprising detecting if the first interface switch selection counter value is greater than or equal to a predetermined pass confirmation low threshold value when a switch either stuck open or chattering latent failure mode is confirmed.

16. The method of claim 15 further comprising detecting if the first interface switch selection counter value is greater than or equal to a predetermined pass confirmation high threshold value when a switch chattering latent failure mode is confirmed.

17. The method of claim 16 further comprising detecting if each ratio of both switch closed counters of the first and the second underlying switches over the first interface switch selection counter is greater than or equal to a predetermined switch non-concurrent threshold value when a switch chattering failure mode has not been confirmed.

18. The method of claim 17 further comprising reporting a switch latent failure mode unconfirmed to the control module when the interface switch is selected and the ratios of the switch closed counters of both the first and the second underlying switches over the first interface switch selection counter are greater than or equal to a predetermined switch non-concurrent threshold value.

19. The method of claim 18 further comprising detecting if the first interface switch selection counter is greater than or equal to a pass confirmation high threshold value when the ratio of the switch closed counters of either the first or the second underlying switches over the second interface switch selection confirmation counter is not greater than or equal to a predetermined switch non-concurrent threshold value.

20. The method of claim 19 further comprising reporting a switch latent failure mode unconfirmed to the control module when the first interface switch selection counter is not greater than or equal to a pass confirmation high threshold value.

21. The method of claim 16 further comprising detecting if each ratio of both switch closed counter values of the first and the second of the at least two underlying switches over the first interface switch selection counter value is greater than or equal to a predetermined switch toggle threshold value when the first interface switch selection counter value is greater than or equal to the predetermined pass confirmation high threshold value.

22. The method of claim 21 further comprising detecting if each ratio of both switch open counter values of the first and the second of the at least two underlying switches over the first interface switch selection counter value is greater than or equal to the predetermined switch toggle threshold value when each ratio of both switch closed counter values of the first and the second of the at least two underlying switches over the first interface switch selection counter value is greater than or equal to the predetermined switch toggle threshold value.

23. The method of claim 22 further comprising reporting a switch latent failure mode unconfirmed to the control module when the interface switch is selected, and each ratio of both switch open counter values of the first and the second of the at least two underlying switches over the first interface switch selection counter value is greater than or equal to the predetermined switch toggle threshold value.

24. The method of claim 22 further comprising reporting a switch latent failure mode unconfirmed to the control module when the ratio of either of the switch closed counter values of the at least two underlying switches over the first interface switch selection counter value is not greater than or equal to the predetermined switch toggle threshold value or the ratio of either of the switch open counter values of the at least two underlying switches over the first interface switch selection counter value is not greater than or equal to the predetermined switch toggle threshold value.

25. The method of claim 15 further comprising detecting if the ratio of the first underlying switch closed counter value over the first interface switch selection counter value is less than or equal to a predetermined switch concurrent threshold high value and greater than or equal to a predetermined switch concurrent threshold low value when neither a stuck open nor a chattering latent failure mode is not confirmed.

26. The method of claim 25 further comprising detecting if the ratio of the second underlying switch closed counter value over the first interface switch selection counter value is less than or equal to the predetermined switch concurrent threshold high value and greater than or equal to the predetermined switch concurrent threshold low value when the ratio of the first underlying switch closed counter value over the first interface switch selection counter value is less than or equal to a predetermined switch concurrent threshold high value and greater than or equal to a predetermined switch concurrent threshold low value.

27. The method of claim 26 further comprising reporting no switch latent failure mode confirmed to the control module and resetting all counters and the adaptive underlying switch chatter detection timer when the interface switch is not selected, and the ratio of the second underlying switch closed counter value over the first interface switch selection counter value is less than or equal to the predetermined switch concurrent threshold high value and greater than or equal to the predetermined switch concurrent threshold low value.

28. The method of claim 12 further comprising reporting no switch latent failure mode confirmed to the control module and resetting all counters and the adaptive underlying switch chatter detection timer when the interface switch is not selected and the first interface switch selection counter value is greater than or equal to a predetermined pass confirmation maximum threshold value.

29. A method for detecting a latent failure mode in an electronic park brake button having an interface switch and at least two underlying switches comprising:
    Incrementing a first interface switch selection counter if a first or a second of the at least two underlying switches is selected greater than or equal to a predetermined switch status confirmation time;
    incrementing a first underlying switch closed counter each time the first of the at least two underlying switches is closed from an open state;
    incrementing a first underlying switch open counter each time the first of the at least two underlying switches is opened from a closed state;
    incrementing a second underlying switch closed counter each time the second of the at least two underlying switches is closed from an open state;
    incrementing a second underlying switch open counter each time the second of the at least two underlying switches is opened from a closed state;
    detecting if the first interface switch selection counter value is greater than or equal to a predetermined stuck open confirmation minimum threshold value;
    detecting if a first of the at least two underlying switches is stuck open when the first interface switch selection counter value is greater than or equal to a predetermined stuck open confirmation minimum threshold value;
    detecting if a second of the at least two underlying switches is stuck open when the first interface switch selection counter value is greater than or equal to a predetermined stuck open confirmation minimum threshold value;
    reporting a switch latent failure mode to a control module when either the first or the second of the at least two underlying switches is detected as stuck open when the interface switch selection counter value is greater than or equal to a predetermined stuck open confirmation minimum threshold value; and
    activating a switch latent failure mode operator alert and resetting all counters and the adaptive underlying switch chatter detection timer after the switch latent failure mode is reported.

30. A method for detecting a latent failure mode in an electronic park brake button having an interface switch and at least two underlying switches comprising:
    incrementing first and second interface switch selection counters if a first or a second of the at least two underlying switches is selected greater than or equal to a predetermined switch status confirmation time;
    incrementing a first underlying switch closed counter each time if the first of the at least two underlying switches is closed from an open state, and incrementing a first underlying switch open counter each time if the first of the at least two underlying switches is opened from a closed state;
    incrementing a second underlying switch closed counter each time if the second of the at least two underlying switches is closed from an open state, and incrementing a second underlying switch open counter each time if the second of the at least two underlying switches is opened from a closed state;
    incrementing a third underlying switch closed counter each time if the first of the at least two underlying switches is closed from an open state, and incrementing a third underlying switch open counter each time if the first of the at least two underlying switches is opened from a closed state;
    incrementing a fourth underlying switch closed counter each time if the second of the at least two underlying switches is closed from an open state, and incrementing a fourth underlying switch open counter each time if the second of the at least two underlying switches is opened from a closed state;
    detecting if a first or a second of the at least two underlying switches is stuck open when the first interface switch selection counter value is greater than or equal to a predetermined stuck open confirmation minimum threshold value;
    detecting if the first or the second of the at least two underlying switches is chattering when the second interface switch selection counter value is greater than or equal to a predetermined switch chattering confirmation minimum threshold value;
    reporting a switch latent failure mode is confirmed to a control module when the first or the second of the at least two underlying switches is detected as stuck open when the first interface switch selection counter value is greater than or equal to a predetermined stuck open confirmation minimum threshold value;
    reporting a switch latent failure mode is confirmed to the control module when the first or the second of the at least two underlying switches is detected as chattering when the second interface switch selection counter value is greater than or equal to a predetermined switch chattering confirmation minimum threshold value; and activating a switch latent failure mode operator alert and resetting all counters and the adaptive underlying switch chatter detection timer after the switch latent failure mode is reported.

* * * * *